Dec. 20, 1966 MASATOSHI MIGITAKA ET AL 3,293,089

ZENER DIODE ELEMENT OF LOW JUNCTION CAPACITANCE

Filed Aug. 21, 1963

INVENTOR.
Masatoshi Migitaka
Takashi Tokuyama
BY
Mestern + Mestern
Atts.

United States Patent Office 3,293,089

Patented Dec. 20, 1966

3,293,089
ZENER DIODE ELEMENT OF LOW JUNCTION CAPACITANCE

Masatoshi Migitaka and Takashi Tokuyama, Tokyo-to, Japan, assignors to Kabushiki Kaisha Hitachi Seisakusho, Chiyoda-ku, Tokyo-to, Japan, a joint-stock company of Japan Filed Aug. 21, 1963, Ser. No. 303,517
Claims priority, application Japan, Aug. 23, 1962, 37/34,951
1 Claim. (Cl. 148—33)

This invention relates to so-called Zener diodes, and more particularly it relates to a new Zener diode element having a high allowable dissipation and, moreover, a low junction capacitance.

A requirement for a Zener diode for applications such as voltage stabilization of a circuit handling high power is that its allowable dissipation be amply high. In order to meet this requirement, it therefore has been the widely adopted practice to use such diodes of a construction permitting good heat radiation and having a pn junction of large area whereby the current density within the junction is lowered.

However, according to the results of our research, it has been found that, in a Zener diode, in the breakdown state the breakdown phenomenon does not occur uniformly over the entire junction but develops in a concentrated manner at particular points such as the edges or pointed parts of the junction, and that almost all of the current flows through only such points. Since the central part of a junction, in general, is a flat junction part, almost no current flows through this central part of the junction in the breakdown state, and this central part does not participate at all in the breakdown phenomenon.

That is, the central junction part has no function as a Zener diode and merely has the meaningless function of providing a large junction capacitance and increasing the saturation current in the low-current region prior to breakdown. Accordingly, increasing of the junction area with the aim of increasing the allowable dissipation contributes little to the lowering of the current density at the time of breakdown.

In the course of development of the present invention, it has been found that the concentration of the breakdown phenomenon in peripheral region of the junction of the diode is especially pronounced in the case when the junction is formed by the alloying method, the said concentration being due to the existence of structural defects such as the growth of dendritic crystals and inclusions of alloying materials in the said region and due to further causes such as the existence of junction portions which have been subjected to thermal stress due to heat generated during the alloying process.

It has also been verified that a breakdown current begins to flow in a selective manner in the above-said region at a voltage which is slightly lower than that for a normal junction region because an electric field concentrates in the said peripheral region at the time of breakdown.

Furthermore, in such cases wherein it is necessary to reduce the electrostatic capacitance of the junction, for example, in the case of Zener diodes to be used in high-frequency circuits, it is not necessary to resort to complicated fabrication methods in seeking to reduce the junction area. The problem can be solved in a simple manner by effectively utilizing only the above-mentioned points where the breakdown phenomenon is concentrated.

The present invention, which is based on the above-described consideration, contemplates providing a Zener diode wherein the entire junction area is reduced without varying the effective area participating in the breakdown, and the junction capacitance and the saturation current are decreased without lowering the allowable power dissipation.

The nature, principle, and details of the invention will be more clearly apparent by reference to the following description of a preferred embodiment thereof when taken in conjunction with the accompanying drawing in which.

Figure 1:
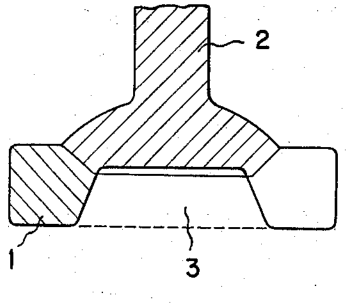
FIGURE 1 is a fragmentary view, in vertical section, showing the junction region of a Zener diode embodying the invention.

Referring to FIGURE 1, the junction region of the Zener diode embodying the invention is formed by alloying an aluminum wire 2 to 0.5 millimeter diameter to a 0.2 ohm cm., n-type silicon pellet 1, subsequently covering the assembly, with the exception of one portion corresponding to the reverse surface 3 of the junction region of the silicon pellet, with an etch-resistant wax, then removing the flat part of the junction by etching with a mixture of hydrofluoric acid and nitric acid so as to produce a junction of a section as shown in FIGURE 1.

Figure 2:
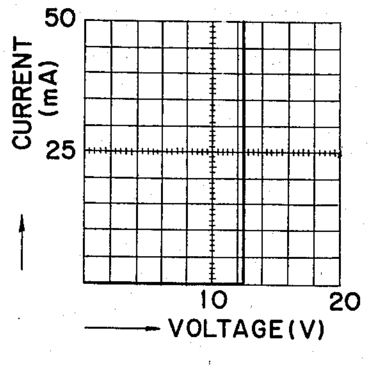
FIGURE 2 is a graphical representation indicating the breakdown characteristic of a conventional Zener diode.
Figure 3:
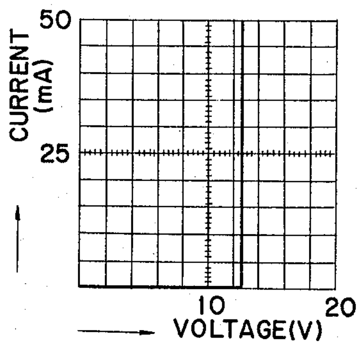
FIGURE 3 is a similar representation indicating the breakdown characteristic of a Zener diode according to the present invention.

The voltage-current characteristic of a Zener diode prior to the above-described etching treatment and that of the Zener diode subsequent to the said treatment are indicated in FIGURES 2 and 3, respectively. As is apparent from these two characteristic curves, there is no detectable change in the characteristic in the breakdown region. This indicates that no current contributing to the breakdown characteristic flowed through the central part which was subsequently removed.

On the other hand, however, it is possible, through the above-described treatment, to reduce the junction capacitance to approximately ⅕ of that prior to said treatment and, moreover, to decrease also the saturation current prior to breakdown to approximately the same degree, whereby the overall characteristic of the Zener diode is greatly improved.

While in the foregoing disclosure, description has been set forth relative to a Zener diode wherein silicon is used as a base, it will be obvious that the present invention is applicable also to the production of Zener diodes wherein germanium and intermetallic compound semiconductors are used as bases.

It should be understood, of course, that the foregoing disclosure relates to only a preferred embodiment of the invention, but that it is intended to cover all changes and modifications of the example of the invention herein chosen for the purposes of the disclosure, which do not constitute departures from the spirit and scope of the invention as set forth in the appended claim.

What we claim is:

A Zener diode of the junction type having p- and n-regions, one of said regions having a grooved portion such that the junction area has only an angular peripheral surface.

References Cited by the Examiner

UNITED STATES PATENTS

| | | | |
|---|---|---|---|
| 2,878,147 | 3/1959 | Beale | 148—1.5 X |
| 2,947,924 | 8/1960 | Pardue | 148—1.5 X |
| 2,980,830 | 4/1961 | Shockley | 148—33.2 X |
| 3,171,762 | 3/1965 | Rutz | 148—1.5 X |

DAVID L. RECK, *Primary Examiner.*

C. N. LOVELL, *Assistant Examiner.*